United States Patent [19]

Yamamoto

[11] Patent Number: 5,617,326
[45] Date of Patent: Apr. 1, 1997

[54] ELECTRONIC CIRCUIT ANALYZING METHOD WITH AUTOMATIC ADJUSTMENT OF FEEDBACK LOOP EFFECTS

[75] Inventor: Takeshi Yamamoto, Tokyo, Japan

[73] Assignee: Kabushiki Kaisha Toshiba, Kawasaki, Japan

[21] Appl. No.: 212,897

[22] Filed: Mar. 15, 1994

[30] Foreign Application Priority Data

Mar. 15, 1993 [JP] Japan .................................. 5-053409

[51] Int. Cl.⁶ .................................................. G06F 15/00
[52] U.S. Cl. .......................... 364/488; 364/489; 364/490; 364/578; 324/73.1; 371/22.3; 371/22.4; 371/25.1
[58] Field of Search .................................. 364/488, 489, 364/490, 491, 578, 468, 801–802, 861, 481; 324/73.1, 207.17, 158.1; 371/25.1, 22.4, 22.3

[56] References Cited

U.S. PATENT DOCUMENTS

| | | | |
|---|---|---|---|
| 4,791,357 | 12/1988 | Hyduke | 324/73.1 |
| 5,047,971 | 9/1991 | Horwitz | 364/578 |
| 5,105,373 | 4/1992 | Rumsey et al. | 364/578 |
| 5,210,699 | 5/1993 | Harrington | 364/578 |
| 5,293,327 | 3/1994 | Ikeda et al. | 364/578 |
| 5,297,066 | 3/1994 | Mayes | 364/578 |
| 5,313,398 | 5/1994 | Rohrer et al. | 364/488 |
| 5,369,604 | 11/1994 | Ravindranath et al. | 364/580 |
| 5,379,231 | 1/1995 | Pillage et al. | 364/578 |
| 5,392,227 | 2/1995 | Hiserote | 364/578 |
| 5,426,768 | 6/1995 | Kanazawa | 395/500 |
| 5,446,676 | 8/1995 | Huang et al. | 364/578 |
| 5,467,291 | 11/1995 | Fan et al. | 364/578 |

FOREIGN PATENT DOCUMENTS

1320580  12/1989  Japan .

*Primary Examiner*—Kevin J. Teska
*Assistant Examiner*—Jacques Louis-Jacques
*Attorney, Agent, or Firm*—Cushman Darby & Cushman, IP Group of Pillsbury Madison & Sutro, LLP

[57] ABSTRACT

A method of analyzing an electronic circuit constructed by combining a plurality of active elements and passive elements includes providing connection information of the electronic circuit, determining a circuit equation based on a model variable which describes the operation characteristic of each of the active and the passive elements and on the connection information, simulating the operation of the electronic circuit by solving the determined circuit equation; automatically seeking, based on the connection information of the electronic circuit, a signal path which forms a feedback loop in the electronic circuit, and adjusting the electronic circuit to remove effects of the feedback loop from electronic circuit.

12 Claims, 9 Drawing Sheets

ELECTRONIC CIRCUIT ANALYZING METHOD WITH AUTOMATIC ADJUSTMENT OF FEEDBACK LOOP EFFECTS

FIELD OF THE INVENTION

The present invention relates to an electronic circuit analyzing apparatus, and more particularly to a simulation-based circuit analyzing apparatus usable for designing a semiconductor analog integrated circuit.

BACKGROUND OF THE INVENTION

In conventional design schemes of semiconductor analog integrated circuits, a circuit simulation tool known as "SPICE" (Simulation Program with Integrated Circuit Emphasis) is widely used. For electronic circuits constructed by combining active and passive elements, "SPICE" calculates the circuit equation by connection information and model variables which describe the operation characteristic of each component which has been given in advance, and simulates the operation of the electronic circuit by solving the circuit equation.

Though "SPICE" performs the circuit simulation and the analysis of the operation of the electronic circuit properly from entered circuit information and model parameters of circuit element, it does not have the best intelligent function like that it analyzes the entered circuit information a high degree, goes the malfunction and point that and developing more, add the improve change automatically to design electronic circuits as evade the malfunction.

In the design scheme of analog integrated circuits, there are various ways and circuits for achieving the same function. Accordingly it is difficult to determine which way or circuit is the best or optimum circuit design scheme for a given specification by a certain regulation. In other words, it requires a professional skill fostered by a long-term experience to design a good analog integrated circuit.

Such situations in analog integrated circuit design schemes have hindered progress of design tools with intelligent circuit analysis and automatic design functions which have keen highly demanded for many years. Further, such situations have made development of automatic circuit design scheme, i.e., CAD scheme (computer aided design scheme of circuits) of the analog integrated circuits behind that of digital integration circuits.

However, there are proper and improper combinations of elements to the specification given to analog circuits. Thus, it is partially possible to determine good or bad designed circuits under certain preconditions. Accordingly it is possible to improve CAD tools to advance the efficiency of circuit design schemes, not to be a fully automatic design scheme by Using such design rule.

in analog integrated circuits, a "feedback" scheme is often used to make circuits stable, highly accurate and to lower their impedances. However this feedback scheme brings a difficult problem of "oscillation" if the scheme carried out under a wrong setup. When a circuit loop forming a feedback path is made in a positive feedback loop, the circuit loop frequently becomes unstable, except in cases using Schmitt circuits, bootstrap circuits and negative impedance circuits. Though the circuit loop forming the feedback path is made in a negative feedback loop for a stabilization, it changes many times un-intentionally to a positive feedback loop by a phase inversion in a high frequency band, so as to cause a high frequency oscillation.

Accordingly, when a designed circuit has a feedback loop, it is important to determine whether the feedback loop is a positive feedback loop caused by incorrect wiring, as well as to determine that, if the feedback loop is the negative feedback loop, it has an oscillation condition in a high frequency band.

Figure 1:
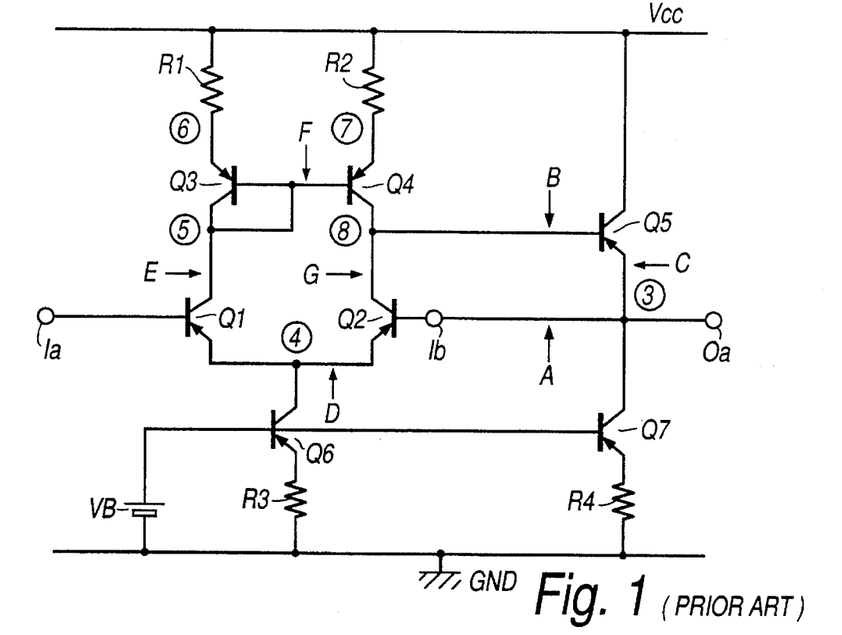
FIG. 1 is a circuit diagram showing a conventional voltage-follower including a feedback loop.

As such a fault determination scheme for a feedback loop, there is a determination scheme based on an open loop characteristic (gain-phase characteristic). One example of the scheme will be explained by the circuit, as shown in FIG. 1. The circuit shown in FIG. 1 is a voltage-follower circuit based on an operational amplifier which comprises a non-inverted input terminal Ia, an inverted input terminal Ib, and an output terminal Oa directly coupled to the inverted input terminal Ib. This voltage-follower circuit is often used as an impedance-changing circuit in analog integrated circuits, especially in analog integrated circuits for audio signal circuits and bias circuits.

This voltage-follower circuit operates as a 100% negative feedback loop for direct currents. However, in a high frequency band the voltage-follower circuit has a possibility of causing oscillations, because the phase in the circuit greatly shifts due to parasitic capacitance, etc., in transistors coupled to a node 4. The oscillation condition presents in a case that, in the feedback loop starting from the output terminal Oa and returning to the inverted input terminal Ib of the operational amplifier as shown in FIG. 1, the gain in a cycle of loop exceeds "1" for the frequency in which a phase in a cycle of loop shifts by 180°. Therefore, as an analysis for determining oscillations, it is enough to calculate the gain-phase characteristic of the feedback loop by inserting a dummy signal source for the analysis in any position of the feedback loop. Though there are various schemes as the practical method of this determining analysis, the article "The Design Scheme of the Transistor Circuit by SPICE", (CQ Publish Company, written by Okamura, first published Jun. 10, 1992, pages 73–74) is known as a scheme to obtain a correct result rather easily by calculating the open loop characteristic with its loop closed.

Figure 2:
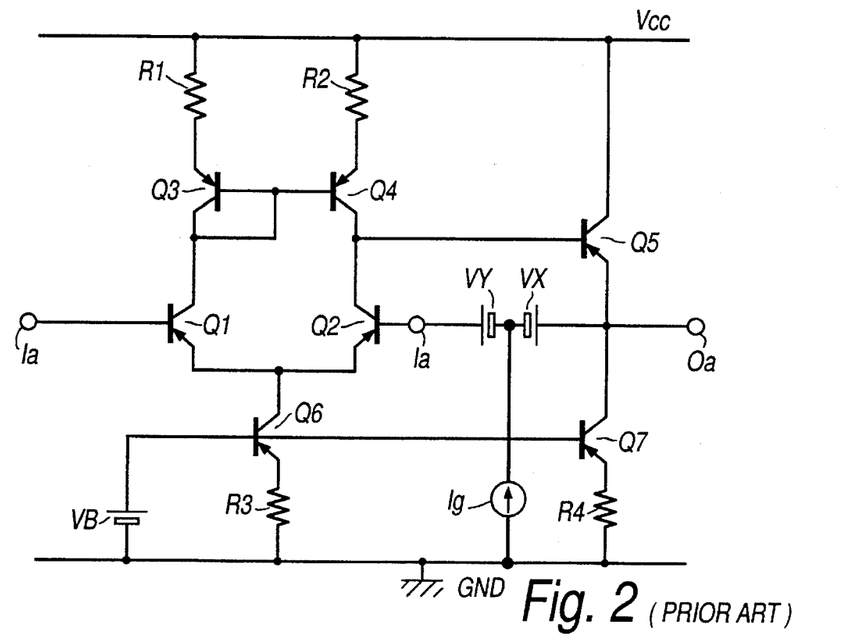
FIG. 2 is a circuit diagram showing a conventional signal current source insertion method for analyzing a feedback loop.
Figure 3A:
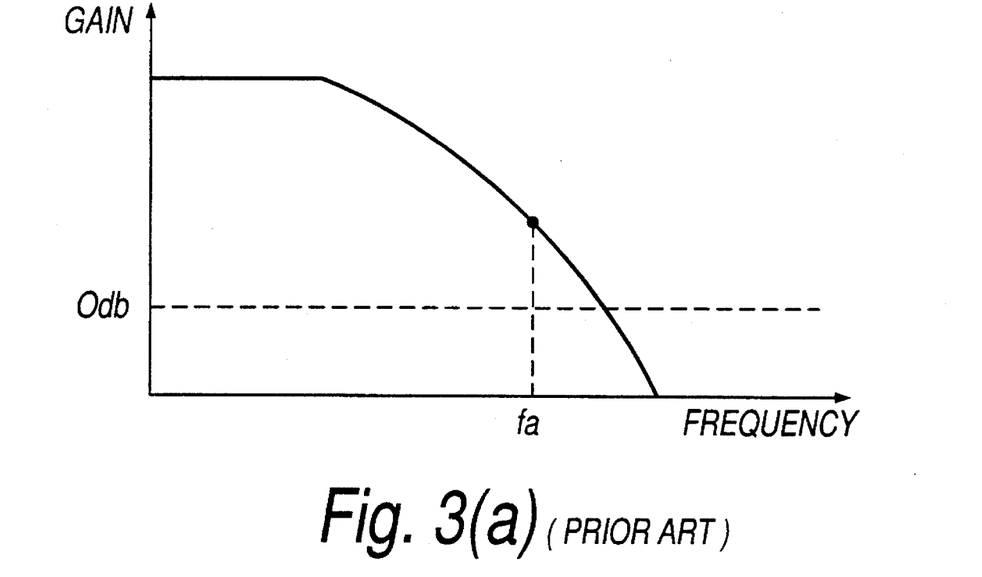
FIGS. 3(a) and 3(b) are a first gain-phase characteristics diagrams of the feedback loop in FIG. 2.
Figure 3B:
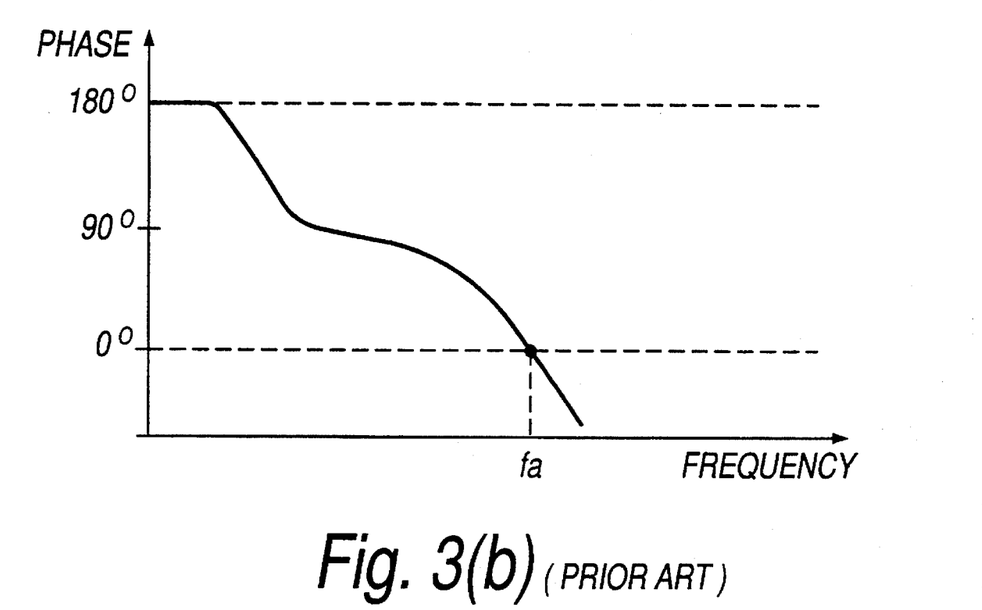
Figure 4A:
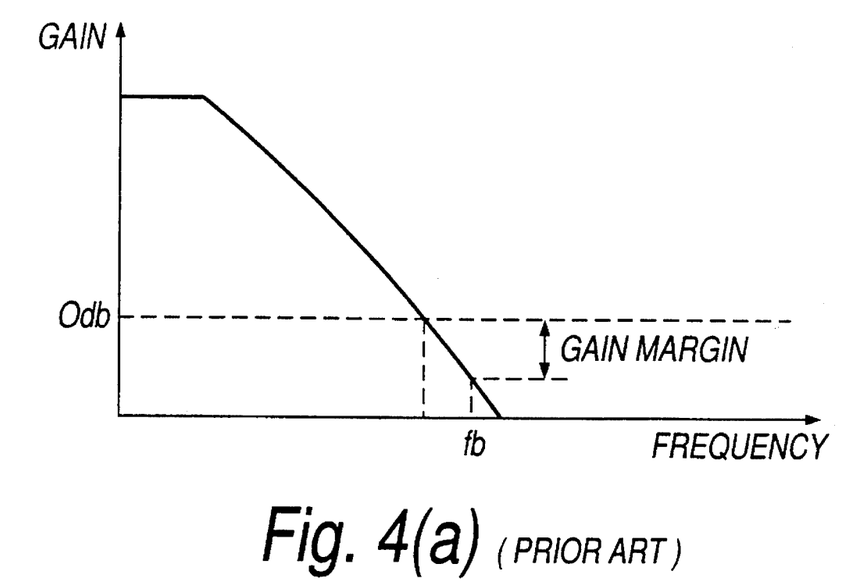
FIGS. 4(a) and 4(b) are second gain-phase characteristics diagram of the feedback loop in FIG. 2.
Figure 4B:
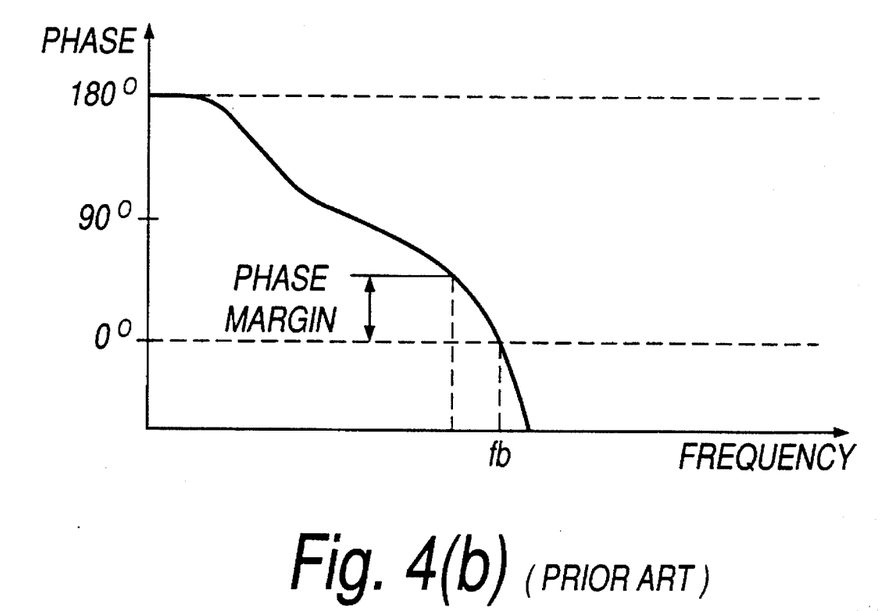

Accordingly, as shown is FIG. 2 as to the circuit in FIG. 1, the risk of oscillation can be determined from both the current gain of the round loop and the frequency characteristic of the phase obtained by inserting the current signal source Ig and current sensor Vx, Vy, and practicing the AC-analysis by SPICE, and finding the ratio I(Vx)/I(Vy) of the currents I(Vx) and I(Vy) flowing through the current sensors Vx and Vy. For example, in the case that the gain-phase characteristics shown in FIGS. 3(a) and 3(b) is obtained by this analysis, oscillation is found at the frequency around the frequency fa because the gain exceeds 0dB (once) at the frequency fa that phase turns 180°. To the contrary, in the case that the gain-phase characteristic shown in FIGS. 4(a) and 4(b) is obtained by this analysis, oscillation will probably not occurred under this condition because the gain is under 0dB (once) at the frequency fa that phase turns 180°.

Figure 5:
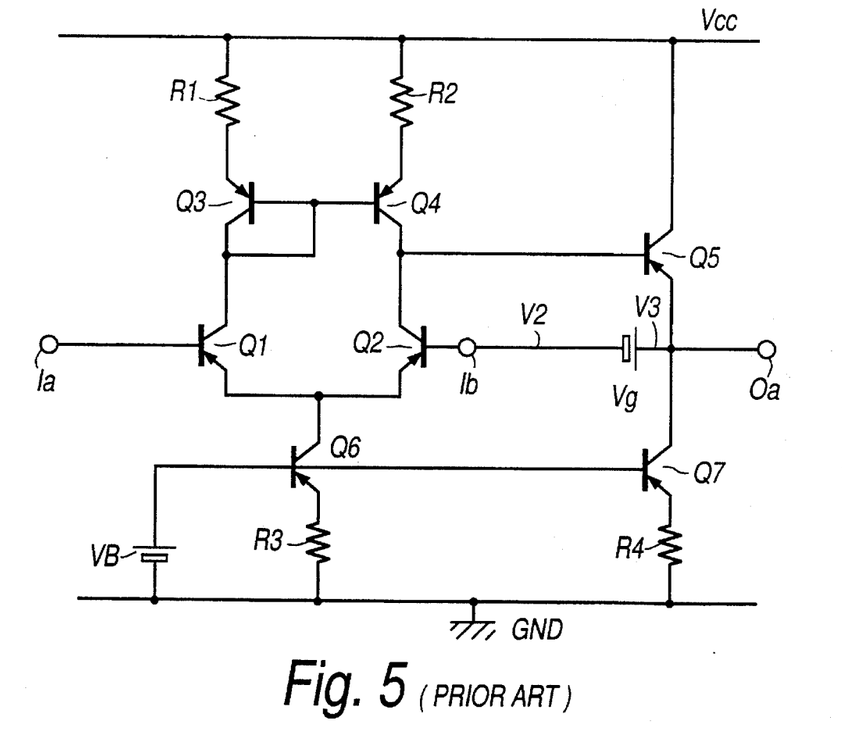
FIG. 5 is a circuit diagram showing a conventional signal voltage source insertion method for analyzing a feedback loop.

The risk of oscillation can also be determined from both the current gain of the round loop and the frequency characteristic of the phase obtained by cutting the same position and inserting a voltage signal source Vg as shown in FIG. 5, in place of the current signal source Ig in FIG. 2, and practicing the AC-analysis, and finding the ratio V2/V3 of amplitude voltages V2 and V3 at the input and output ends of the voltage signal source Vg. This method of the determining analysis is the same case as shown in FIGS. 3(a), 3(b), 4(a) and 4(b).

However, the signal source for use in the determining method as described above is not allowed to be inserted anywhere in the loop. In FIG. 1, the feedback path is formed by joining the output terminal Oa and the inverted input terminal Ib in the operational amplifier, but when the feedback path is formed, the loop is formed by two loops, i.e., the loop circulating in an order of the nodes; 3→8→3 and the loop circulating in an order of the nodes; 3→4→8→3, as shown in FIG. 1. And a determination whether this loop actually oscillation or not is decided by the interaction of this double loop.

Therefore to determine the oscillation of a feedback loop, the accurate determining analysis cannot be done without inserting the signal source into the signal paths sharing these two loops. In the circuit of FIG. 1 a proper position to insert the signal source into the loop can be selected from the positions A, B and C, while the positions D, E, F, G are not proper for this purpose. However, in fact, the intuition of designer was chiefly depended upon because there were not a clear way to determine such a suitable position.

In the case of a simple circuit as shown in FIG. 1, it is rather easy for an experienced circuit designer to determine that the positions A, B, C, are suitable for inserting the signal sources. However, as to actual LSI, especially large scale LSI and LSI conducting complex signals, as feedback loops become very complicated or loops exist of very wide range of circuit elements, it is difficult to seek the feedback loop itself. If it is found, it is very difficult to determine an accurate position for inserting the signal source. At the stage of designing circuits, there are many examples where the signal source inserted into a wrong position and analysis of oscillation is practiced with the incorrect result that there is no risk of oscillation being obtained. Then, when a sample is produced as an experiment, unexpected oscillation occurs. This is one reason why only expert person can design a good analog integrated circuit, and one of the big problems in designs of analog integrated circuits.

As a result of using the above-mentioned scheme, in the case judging that it is clear to oscillate or there is a risk of oscillation because of product dispersion, generally the scheme avoids oscillation by setting a built-in capacitor with a small capacitance in order of pF (pico-Farad) for the phase compensation between the node 8 and the node 5 or between the node 8 and GND in the circuit of FIG. 1. In this case, the smaller the phase compensation is, the more it is economic, so one first applies a capacitor having a small capacitance and performs the determining analysis of oscillations, as described above.

Figure 6:
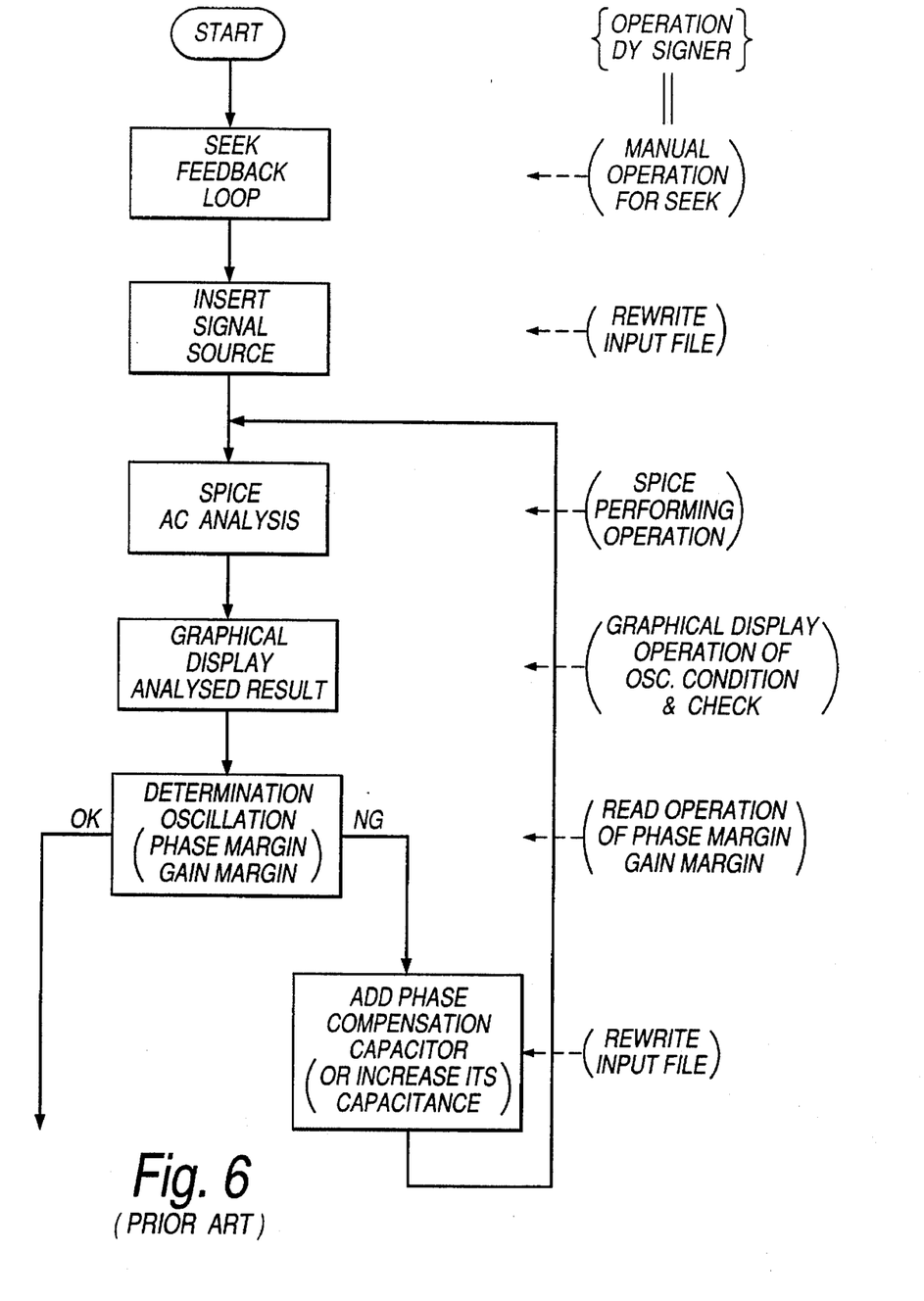
FIG. 6 is a flow-chart showing a design procedure according to a conventional method for preventing oscillations of a feedback loop.

And on observing results of the determining analysis, as shown in FIGS. 3(a), 3(b), 4(a) and 4(b), the capacitance value of the phase compensation capacitor in input file is incremented step-by-step and the same analysis is repeated every time. In this way, until the oscillation conditions at a prescribed preset margin are not satisfied, the scheme continues this procedure for seeking out the most suitable phase compensation capacitance. This procedure is illustrated in FIG. 6.

In the conventional design procedure as described above, it takes a long time to rewrite the phase compensation capacitor in the input file by determining a risk of oscillation by checking the calculation result with the oscillation condition, and to perform various operations on practicing the SPICE in comparison to the time for analyzing in the actual computer. In other words, as a result, a TAT (turn around time) in the design operation using a circuit simulator becomes long and the efficiency of the design operation become worse in spite of using computers.

As described above, the conventional design scheme using the circuit simulator for overcoming oscillations of feedback loops in analog integrated circuits very frequently encounters problems or difficulties as follows.

1. It is difficult to seek unintended positive feedback loops and negative feedback loops with risks of oscillation, and these tend to be overlooked.

2. It is difficult to determine an accurate inserting position of the signal source for determining the operation, so it is inserted into a wrong position, and an accurate result cannot be obtained.

3. A TAT scheme of computer operation up to obtain the most suitable phase compensation capacitance for avoiding the oscillation becomes long, and the efficiency of the design operation also becomes insufficient.

Thus, improvements for the above problems have been desired.

SUMMARY OF THE INVENTION

It is therefore an object of the present invention to provide an electronic circuit analyzing apparatus which sufficiently improves the efficiency of design operation.

Another object of the present invention is to completely remove an oversight of oscillation loops and unsuitable determinations of oscillations without relying on manual design operations by designers.

A further object of the present invention is to provide an environment in which such a design scheme can be performed without malfunctions.

In order to achieve the above object, an electronic circuit analyzing apparatus according to one aspect of the present invention has means that introduce the circuit equation based on linking line information of electronic circuit organizing of the combination of many active elements and many passive elements and model variables writing the property of operation of every circuit element given beforehand and analyze actual operation of the electronic circuit as a practice by solving it, and means that seeks the signal paths forming a feedback loop from the connection information of the electronic circuit, as additional function or application function of the means of analysis as a practice.

According to the above arrangement, the analysis procedure of feedback loops is performed for procedures from a seeking of the feedback loop for determining oscillations the optimum value of phase compensation capacitor by all the mechanical processes only, so it is easy to weave this into all equipment, as a result it is possible to practice all series of those plan disposition automatically.

If this will be taken advantage of, the problem "The oscillation of feedback loop" it have taken a long time and often over looked up to this time in an integrated circuit plan will be able to be handled and will be able to plan efficiency particularly.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present invention will be described in detail with reference to the FIGS. 7 through 12. Throughout the drawings, reference numerals or letters used in FIGS. 1 through 6 and will be used to designate like or equivalent elements for simplicity of explanation.

Figure 7:
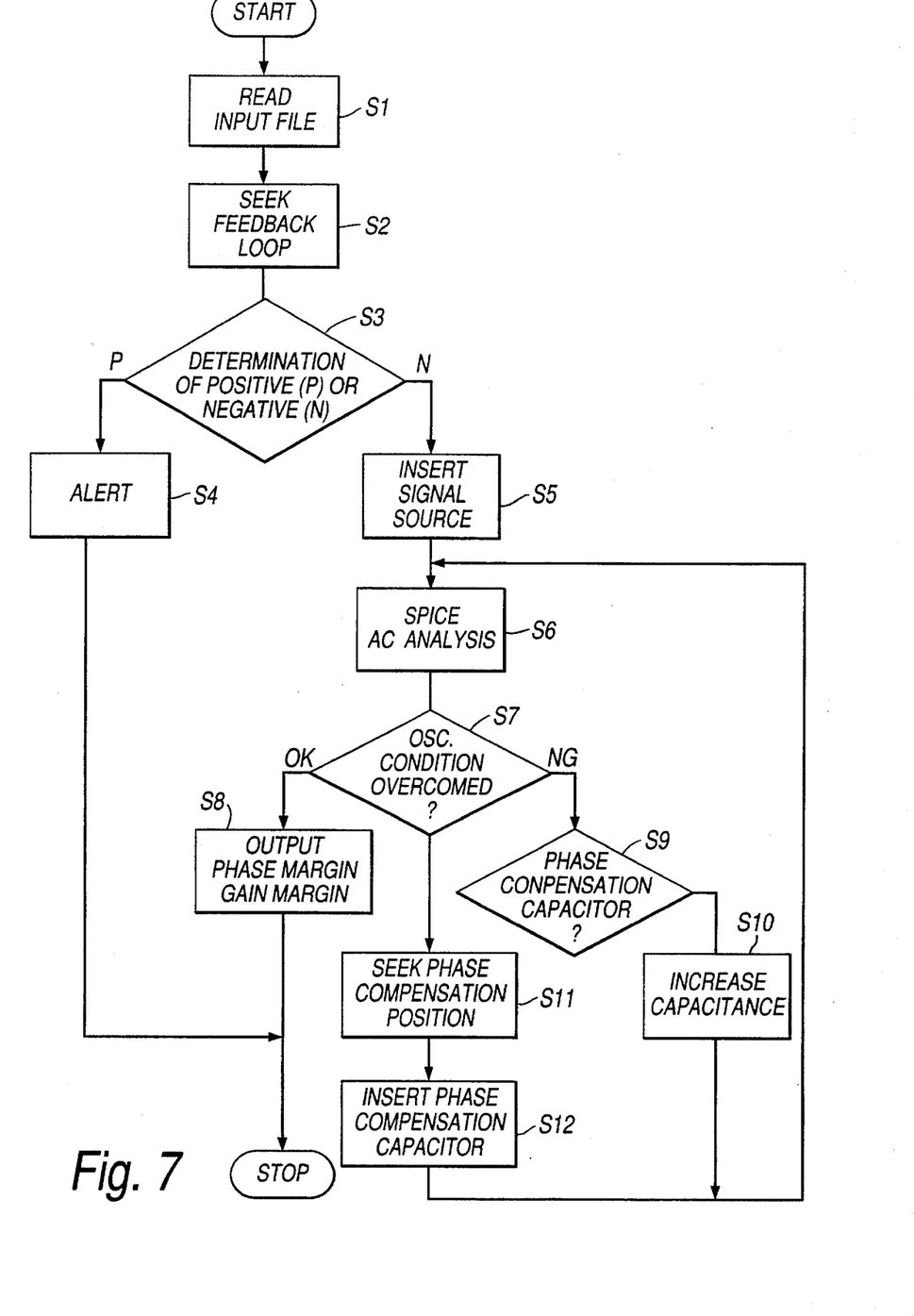
FIG. 7 is a flow chart showing an embodiment of the present invention.

Referring now to FIG. 7, a first embodiment of the electronic circuit analyzing apparatus according to the present invention will be described in detail. This embodiment typically comprises three procedures. The first procedure is an automatic seek operation for feedback loops in an electronic circuit of interest. The second procedure is a set of operations from an insertion of a signal source into a sought feedback loop to a determination of oscillations by an AC analysis result. The last procedure is a set of operations from an insertion of a predetermined phase compensation capacitor for avoiding oscillations into the feedback loop to a calculation of the optimum capacitance value of the phase compensation capacitor.

That is, a feedback loop is automatically sought from connection information of the electronic circuit from a prescribed input file or an entered schematic circuit information (S1). The seeking is practiced by way of looking for signal paths which forward along the direction of the signal path through each node and return to the starting point. In transistors there are three of unidirectional paths, i.e., a base-to-collector path, a base-to-emitter path and an emitter-to-collector path. While each of a diode, a resistor, a capacitor and an inductor has a bidirectional signal path. These features are then applied to the seek operation as a general rule. Also, a rule that a signal path reaching a constant voltage terminal is cut off there is applied to the seek operation. Under the rules if the existence of any feedback loop is determined, only the case that a feedback loop includes two or more transistors is made for such determinations. But a feedback loop including only one transistor is rejected for such determination (S2).

In the case of feedback loops including only one transistor, except oscillation circuits designed for an intentional object, it is improbable for the feedback loop to oscillate in a normal circuit. Besides, if all of the signal paths through the transistor in the feedback loop are the base-to-emitter path, the case may be removed from the analyzing object even though the feedback loop contains two or more transistors. In this case, a gain of the feedback loop cannot be large enough to satisfy the oscillation condition.

Next, it is determined whether the sought feedback loop is a positive or a negative feedback loop as to a direct current. The signal path, going to be inverted in its phase as to the direct current, presents by one that forwards along the base-to-collector path of transistors. Therefore, that can be determined by an amount of node transitions of the base-to-collector in the feedback loop. That is, it is a negative feedback loop if there are an odd-number of node transitions with the base-to-collector path. While it is a positive feedback loop if there are an even-number of node transitions with the base-to-collector path (S3). If it is a positive feedback loop, the possibility of the operation of the feedback loop being unstable is large. So a warning saying that a corrective measure should be taken is indicated (S4). In the case the sought feedback loop is a negative feedback loop, this feedback loop in a high frequency band should be determined if it comes to oscillation being a positive feedback by the phase shift, which moves to a next step S5.

As mentioned above, one part of the feedback loop is cut and a signal source is inserted, and an open loop characteristic is searched for with AC analysis of 'SPICE' (S6). The problem is which part of the feedback loop should be cut and inserted the signal source in this case. Any part is basically the same if it is a simple feedback loop, but there are cases where a part of the feedback loop shares a part of another feedback loop, or a branch signal path starting from a node of a feedback loop and returning there through another signal path. In feedback loops having such a complicated configuration, some limitations that a signal source should be inserted in the common signal path while a signal should not be inserted in the branch signal path are provided (S5).

The open loop characteristic of the feedback loop is carried out with AC analysis of 'SPICE', and gain characteristic and phase characteristic of loop round is searched for. The high frequency band of the open loop characteristic obtained is paid attention to, and if it holds true of the general oscillation conditions, "As to frequency whose round phase turns 180°, round gain exceeds 1" or "As to frequency whose round gain is less than 1, round phase turn exceeds 180°", it is determined that there is a risk of oscillation (S7). If it does not hold true of those conditions, oscillation does not occur. Then the amount of the gain lowering under the gain 1, i.e., the unit of gain at a frequency that the phase in a cycle of loop shifts by 180° becomes the gain margin. Similarly the amount of phase lowering under 180°, which corresponds to the amount of gain, becomes the phase margin. As a result of such a determination, information such as the existence of the oscillation, the phase margin, and the gain margin are output (S8).

In this way, as a result of determining the existence of the oscillation of the feedback loops, there is thought to be a risk of the oscillation if phase margin or gain margin cannot avoid the oscillation condition using the margin given beforehand, and phase compensation countermeasure for an improvement should be taken measure to satisfy the situation. Determining whether there is phase compensation capacitor given an account of being for phase compensation in the input data beforehand-or not (S9), then in the case there is already a phase compensation capacitor, its capacitance value is increased by an amount determined beforehand, for example, plus 30%, and the AC analysis and the determination of oscillations is repeated. In this way, as increasing capacitance value gradually, the most suitable phase compensation capacitance value is searched for with the repetition of this continuous calculation until the standard of oscillation circuit given beforehand is cleared (S10). For implementing the step 10 there are various ways. For example, a technique of changing the size of the step for increasing the capacitance from a rough step used for reaching fast a predetermined distance close to the optimum value to a fine step for seeking the optimum value, a technique of adaptively varying the size of the step according to the differences of the actual values of the phase margin and the gain margin to their standard values, and so on.

In the case that compensation capacitor does not exist in the feedback loop, first of all a position that the compensation capacitor is to be applied will be sought. As for a part of such a phase compensation, generally it is the best way for applying the compensation capacitor to the node having the highest impedance in the feedback loop. As the way of analyzing impedance of each node in the feedback loop, each node is connected with the source of the signal current, and that can be implemented by calculating the amount of the voltage change to the small change of the current (S11).

Accordingly, by inserting a small capacitor with the capacitance in the order of pF between a selected high impedance terminal and a constant voltage terminal, such as the grounded terminal or the voltage source terminal Vcc, the calculations of the AC analysis and the determination of the oscillation are repeatedly continued until the best phase compensation capacitance value is obtained (S12). As the position for inserting the phase compensation capacitor, there is a case that the capacitor is allowed to be inserted between a collector terminal at a high impedance and a base terminal of a transistor.

Figure 8:
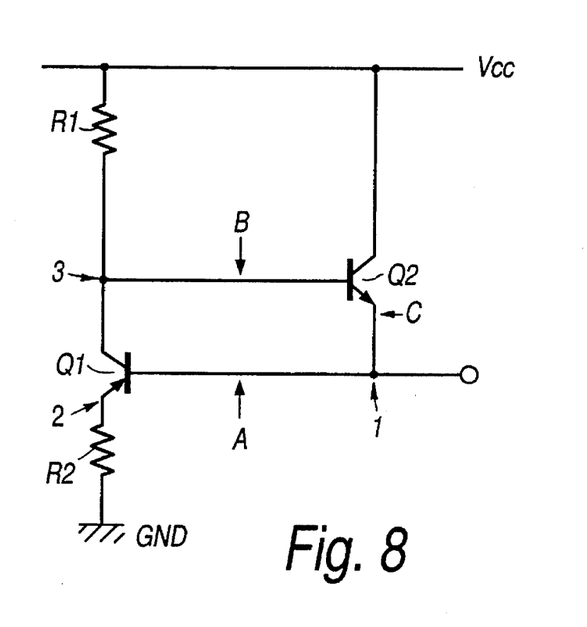
FIG. 8 is a circuit diagram showing an embodiment of the present invention adapted for a feedback-type bias circuit.
Figure 9:
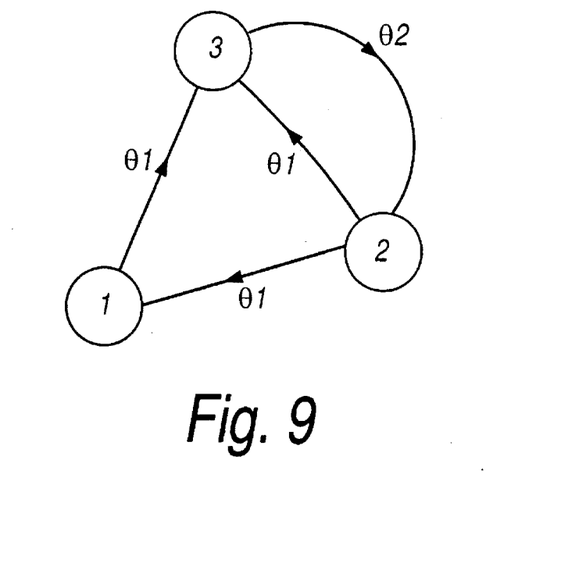
FIG. 9 is a graph showing a seek operation of feedback loops in the circuit of FIG. 8.

Among the ways of analyzing feedback loops, a method of inserting signal sources for seeking the feedback loop and calculating the open loop characteristic will be explained in more detail using an embodiment adapted to the most basic feedback type bias circuit, which is often used in an analog integrated circuit, as shown in FIG. 8. FIG. 9 shows a routing diagram obtained by applying the seeking scheme of the signal path to the circuit as shown in FIG. 8.

In FIG. 8, the signal path from the node 1 to the node 3 represents the base-to-collector path of the transistor Q1. Similarly, the signal path from the node 1 to the node 2 represents the base-to-emitter path of the transistor Q1. The signal path from the node 2 to the node 3 represents the emitter-to-collector path of the transistor Q1. The signal path from the node 3 to the node 1 represents the base-to-emitter path of the transistor Q2. From FIG. 8, it is seen that the feedback loop consist of a loop and branch signal paths. The feedback loop is the one which starts from the node 1 and returns to the node 1 through the node 3. The branch signal paths are the one that starts from the node 1 and reaches the node 2 and the one that starts from the node 1 and reaches the node 3 through the node 2. The inserting position of the signal source for calculating the open loop characteristic is not to be set on the branch signal paths of feedback loop, but on the signal path returning from the node 3 to the node 1.

Viewing the feedback loop as shown in FIG. 9 from another point of view, it is possible to be seen that the feedback loop consists of two loops. One is a loop starting from the node 1 and returning thereto through the node 3, and the other is a loop starting from the node 1 and returning thereto through the nodes 2 and 3. It is possible to be determined as the negative feedback loop if there are an odd number of node transitions of the base-to-collector path. While it is determined as the positive feedback loop if there are an even number of such node transitions. Applying the way of determining whether the feedback loop is positive or negative, it is seen that the former is a negative feedback loop and the latter is a positive feedback loop. The latter case, i.e., the negative feedback loop actually works dominantly in this circuit, while the former case, i.e., the positive feedback loop works to suppress the negative feedback operation.

In the case that there are two positive and negative loops as described above, for mechanically determining whether a feedback loop is a positive one or a negative one in whole, it is best to calculate the characteristic of the open loop and determine that. The state of oscillation in this case is determined by the adaptive effect of the two feedback loops, so it is better that the dummy signal source for calculating the characteristic of the open loop, be put on the path from the node 3 to the node 1, where the common path of the two feedback loops exists. This conforms to the position of the inserting signal source in the case mentioned above where the feedback loop is consists of one loop and one branch signal path. Therefore, in FIG. 8, one of locations A, B, or C illustrates the position of the inserting signal source.

Figure 10:
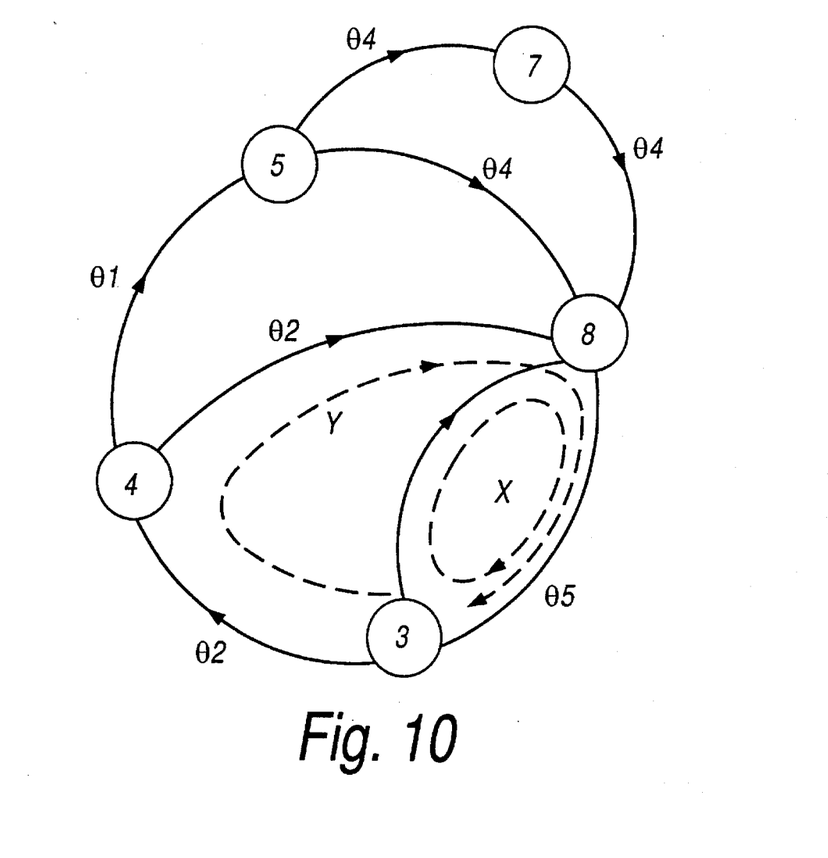
FIG. 10 is a graph showing a seek operation of feedback loops in the circuit of FIG. 1.

FIG. 10 shows the result in the FIG. 1 added the node number in the conventional circuit as shown in FIG. 1, the result that the way of seeking signal path according to the present invention, that is to say some of among the transistor, diode, resistor, capacitor inductor, voltage source, or according to the signal way of the electronic circuit including all these, as the uni-directional signal path, from the base of the transistor to the collector, from the base to the emitter, from the emitter to the collector. As the bi-directional signal path between the both terminals of the diode, resistor, capacitor inductor, under the rule of going along the direction of signal path not including the constant voltage terminal, seek a signal path returning to the starting point, and presents the sickout feedback loop of the signal path as an object to be analyzed.

In FIG. 10, although it is possible to take a view on different signal paths of a feedback loop and a branch path, here it is taken in interest of the two feedback loops (X) and (Y) as shown in FIG. 7. That is to say, the voltage-follower circuit as shown in FIG. 1 has two feedback loops as represented by following transition orders of the nodes.

(X) ... 3→8→3

(Y) ... 3→4→8→3 and two branch paths as also represented by following transition orders of the nodes.

4→5→8; in parallel with the path 4→8

5→7→8; in parallel with the path 5→8 think as being composed of the branch signal path.

On the point that the double feedback loop is the former is the negative feedback loop, the latter is the positive feedback loop and the former is dominantly, this is all the same as the case of FIG. 8.

In this example, it is better to set the dummy signal source for calculating the open loop characteristic on the way from the node 8 to the node 3, where the common path of the two feedback loops is present. Therefore, it is inserted into the position of any position of A, B and C in FIG. 1.

Figure 11:
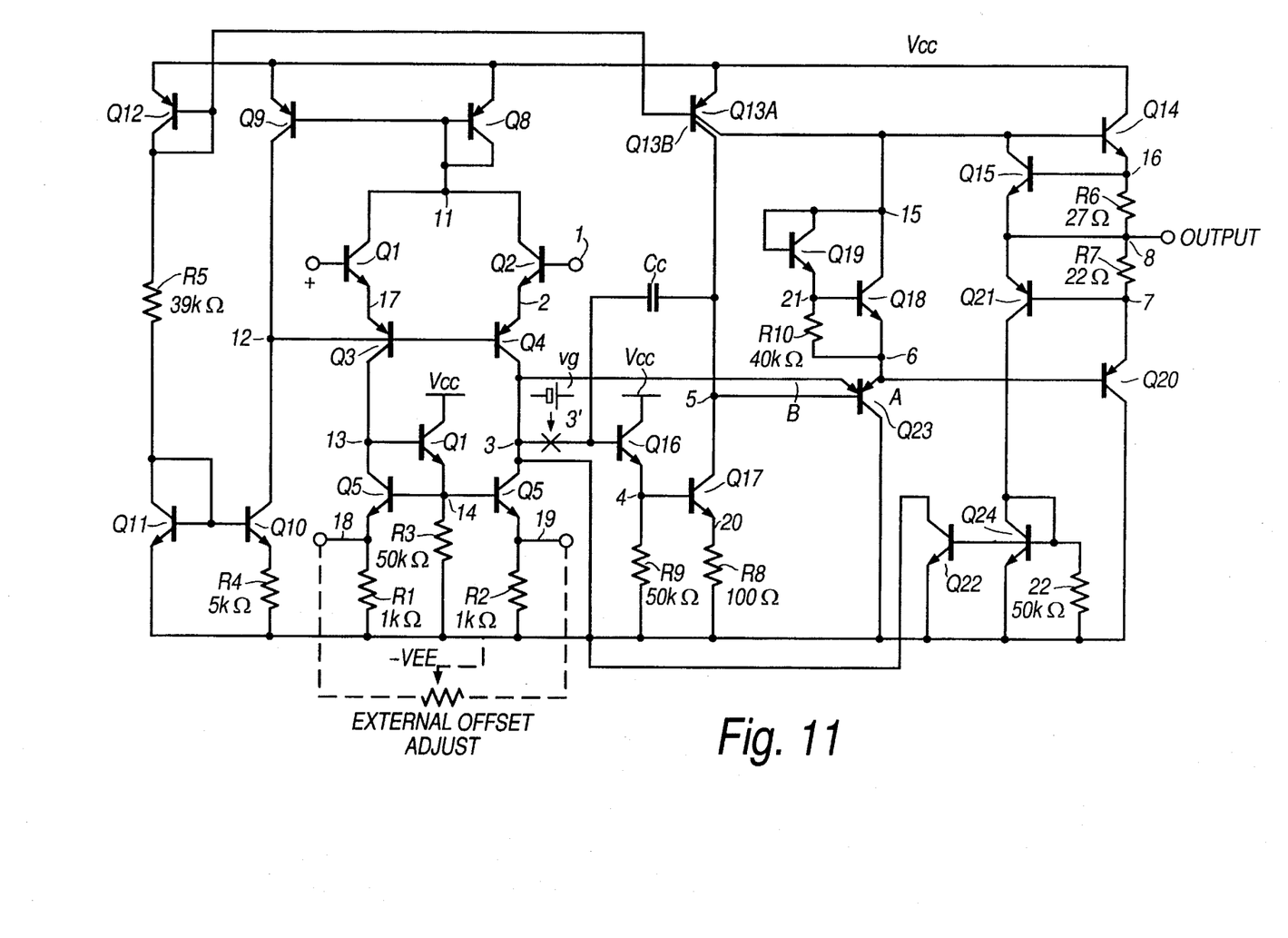
FIG. 11 is a circuit diagram showing an embodiment of the present invention adapted for an operational amplifier having a voltage follower arrangement.

FIG. 11 indicates a more complex example wherein the voltage follower circuit is constituted by the well-known "TYPE 741" operational amplifier, in which terminals 1 and 8 are short-circuited. This is applied to the method of seeking signal paths, and is indicated the result of the seek operation of the feedback loop. The circuit figure of 741 operational amplifier is from "Analog Integrated Circuit Design Technique for Super LSI, the Last Volume", page 344, written by P. R Gray and R. G. Mayer, translated under the supervision of Nagata, and published from Baifukan on Nov. 30, 1990.

Figure 12:
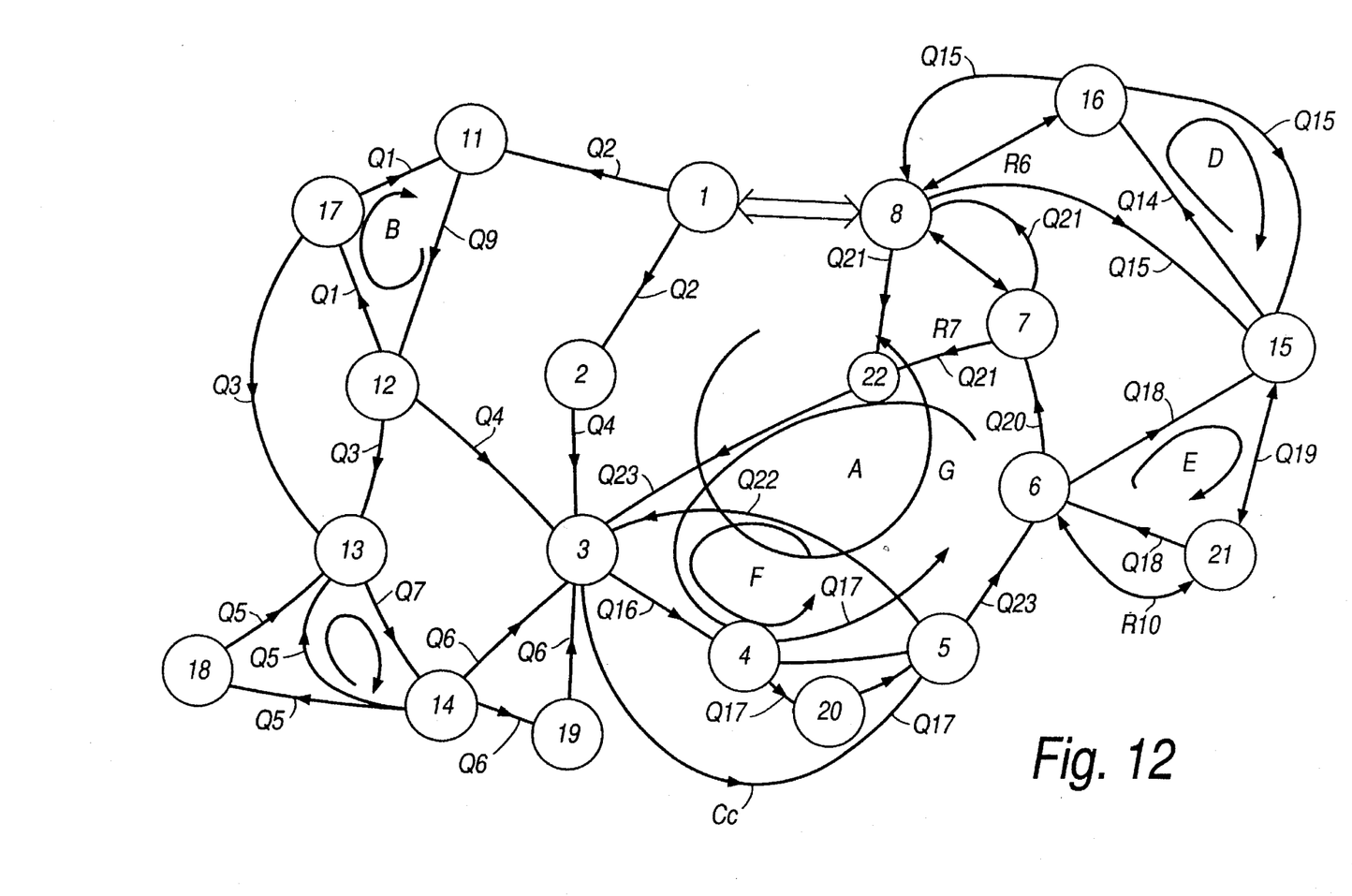
FIG. 12 is a graph showing a seek operation of feedback loops in the circuit of FIG. 11.

In the sought feedback loops as shown in FIG. 12, the feedback loop A from the output terminal of operational amplifier (node 8) to the inverted input terminal (node 1) constitutes the basic feedback loop and has the following transition order of the nodes.

A . . . 1→2→3→4→5→6→7→8→1

This feedback loop A also forms a triple feedback loop with the following two feedback loops F and G.

F . . . 3→4→5→3

G . . . 3→4→5→6→7→22→3

The signal path through the node 20 as to the feedback loop F and the signal path through the node 8 as to the feedback loop G are regarded as the branch signal path. In these three feedback loops, the number of the paths form the base-to-collector path are the feedback loop A is 1, the feedback loop F is 1, the feedback loop G is 3, and all of the feedback loops are odd numbers, so these feedback loops are all negative feedback loops. The inserting point of signal source for determining the oscillation should be set on the common signal path, so take notice of the path of the node 3 to the node 4, which is the common signal path of three feedback loops, and divide the transistors Q4, Q6, Q22, Q23 output the signal to the node 3 into the terminal transistor Q16, Cc receive the signal from a new node 3', and the dummy signal source Vg should be set between the original node 3 and the new node 3' as shown in FIG. 11.

There are still four feedback loops mentioned below on the branch signal path in main feedback loop A in the sought feedback loop in FIG. 12, namely:

B . . . 11→12→17→11

C . . . 13→14→13

D . . . 15→16→15

E . . . 6→15→21→6

The signal path through the node 18 as to the feedback loop C and the signal path through the node 8 as to the feedback loop D are regarded as the branch signal path in this part. Among this, the except of the feedback loop of the feedback loop E is the negative feedback loop, and there is no possibility that feedback loop E get a gain 1 or more, so it does not cause oscillation and unstable operation.

These feedback loops only share a part of the branch signal path of main feedback loop A, and should determine separately the oscillation, with the feedback loop A. However, a feedback loop not including two transistors or more, e.g., a feedback loop having a combination of one transistor and one resistor, like the transistor Q18 and the resistor R10, the combination of the transistor Q21 and the resistor R7 or the combination of the transistor Q15 and the resistor R6 does not essentially constitute an oscillation feedback loop. Thus such a feedback loop is removed from the object to be determined.

In this way, by cutting the analysis function of feedback loop of above mentioned embodiment in the calculating device with function of analog circuit simulator such as SPICE, as to the entered analog circuit information, from the seek operation of the feedback loop for determining oscillations and the optimum phase compensation capacitance value can be done exactly with the automatic of without through the operation of operator.

Accordingly, if this will be taken advantage of, the problem of "the oscillation of feedback loop", it have taken a long time and often over looked up to this time in an integrated circuit plan will be able to be handled and will be able to a plan efficiency particularly.

As described above, the circuit analyzing apparatus according to the present invention can accomplish the analysis of electronic circuits for accurate determination of oscillation only easy automatic operation even if however complicated construction of circuit, so it can improve the design efficiency sharply.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A method of analyzing an electronic circuit constructed by combining a plurality of active elements and passive elements, the method comprising the steps of:

providing connection information of the electronic circuit;

determining a circuit equation based on a model variable which describes the operation characteristic of each of said active and of each of said passive elements and on said connection information;

simulating the operation of the electronic circuit by solving the determined circuit equation;

automatically seeking, based on the connection information of the electronic circuit, a signal path which forms a feedback loop in the electronic circuit; and adjusting the electronic circuit to remove effects of the feedback loop from the electronic circuit, wherein the step of automatically seeking comprises seeking a signal path in the circuit which includes at least some of a transistor, a diode, a resistor, a capacitor, a inductor and a voltage source, wherein a uni-directional path of the signal path is given by at least one of:

a base-to-collector path of the transistor, a base-to-emitter path of the transistor, and an emitter-to-collector path of the transistor, while a bi-directional path of the signal path is given by a path across a terminal of the diode, the resistor, the capacitor and the inductor, and their path proceeds along the signal path without containing a constant voltage source terminal.

2. A method as in claim 1, wherein the step of automatically seeking seeks a feedback loop containing at least two transistors.

3. A method as in claim 1, wherein said step of adjusting comprises the steps of:

inserting a dummy signal source in the feedback loop, and calculating gain responses and phase responses of the feedback loop at various prescribed frequencies.

4. A method as in claim 3, wherein the dummy signal source is inserted in a common path partially shared between a main path of the feedback loop and another main path of another feedback loop.

5. A method as in claim 3, wherein the dummy signal source is prohibited from being inserted in the feedback loop at a position other than a branch path branched off from a prescribed position of the feedback loop and returning to another position of the feedback loop via a different path.

6. A method as in claim 3, further comprising the step of:

determining a risk of oscillation in the feedback loop by adapting the gain characteristic and the phase characteristic of the feedback loop to a general oscillation condition to provide information regarding whether the risk of oscillation presents information regarding a phase margin, or information regarding a gain margin.

7. A method as in claim 3, further comprising the steps of:

inserting into the feedback loop a capacitor for preventing oscillation of the feedback loop; and establishing an optimum capacitance value for the capacitor by repeatedly incrementing the capacitance value of the capacitor step-by-step until the gain characteristic and the phase characteristic of the feedback loop obtained satisfy conditions present for a stable operation.

8. A method as in claim 7, further comprising the steps of:

inserting the oscillation preventing capacitor between:

a position having one of an impedance higher than a prescribed value and the highest impedance in the feedback loop, and one of a constant voltage terminal of the power source and a ground potential source.

9. A method as in claim 8, wherein the impedance is analyzed by coupling a signal current source to various positions in the feedback loop, and detecting a voltage change responsive to a change of the signal current at each position to calculate the impedance at the position.

10. A method as in claim 7, further comprising the steps of:

seeking a uni-directional path of a base-to-collector node transition in the feedback loop, and inserting the oscillation preventing capacitor across the base-to-collector path having an impedance higher than a prescribed value.

11. A method as in claim 1, further comprising the steps of:

determining whether the feedback loop is a positive feedback loop; and, when the feedback loop is determined to be a positive feedback loop, alerting that the feedback loop is subject to an unstable operation.

12. A method as in claim 1, wherein the step of determining comprises:

determining the feedback loop to be a positive feedback loop when an even number of base-to-collector node transitions are contained in the loop.

* * * * *